(12) United States Patent
Tseng et al.

(10) Patent No.: US 10,706,914 B2
(45) Date of Patent: Jul. 7, 2020

(54) STATIC RANDOM ACCESS MEMORY

(71) Applicant: UNITED MICROELECTRONICS CORP., Hsin-Chu (TW)

(72) Inventors: Chun-Yen Tseng, Tainan (TW);
Ching-Cheng Lung, Tainan (TW);
Yu-Tse Kuo, Tainan (TW);
Chun-Hsien Huang, Tainan (TW);
Hsin-Chih Yu, Hsinchu County (TW);
Shu-Ru Wang, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/019,521

(22) Filed: Jun. 26, 2018

(65) Prior Publication Data

US 2019/0362776 A1    Nov. 28, 2019

(30) Foreign Application Priority Data

May 28, 2018    (CN) .......................... 2018 1 0523016

(51) Int. Cl.
| | |
|---|---|
| *G11C 11/00* | (2006.01) |
| *G11C 11/412* | (2006.01) |
| *G11C 11/419* | (2006.01) |
| *H01L 43/08* | (2006.01) |
| *G11C 7/12* | (2006.01) |
| *H01L 27/11* | (2006.01) |
| *H01L 43/02* | (2006.01) |
| *H01L 43/10* | (2006.01) |
| *G01R 33/09* | (2006.01) |
| *G11C 8/08* | (2006.01) |

(52) U.S. Cl.
CPC .......... *G11C 11/412* (2013.01); *G01R 33/091* (2013.01); *G11C 7/12* (2013.01); *G11C 8/08* (2013.01); *G11C 11/419* (2013.01); *H01L 27/1104* (2013.01); *H01L 43/02* (2013.01); *H01L 43/08* (2013.01); *H01L 43/10* (2013.01)

(58) Field of Classification Search
CPC ....... G11C 11/412; G11C 11/419; G11C 7/12; G11C 8/08; G11C 14/0081; H01L 27/1104; H01L 43/02; H01L 43/08; H01L 43/10
See application file for complete search history.

(56) References Cited

U.S. PATENT DOCUMENTS

| | | | |
|---|---|---|---|
| 7,079,415 B2* | 7/2006 | Frey ........................ | G11C 11/16 365/171 |
| 7,164,608 B2 | 1/2007 | Lee | |
| 7,791,941 B2 | 9/2010 | Hanafi | |

(Continued)

OTHER PUBLICATIONS

Hsu, A RRAM Integrated 4T SRAM with Self-Inhibit Resistive Switching Load by Pure CMOS Logic Process; Nanoscale Research Letters, 2017.

*Primary Examiner* — Toan K Le
(74) *Attorney, Agent, or Firm* — Winston Hsu

(57) ABSTRACT

A static random access memory (SRAM) structure includes a first inverter comprising a first pull-up transistor and a first pull-down transistor, a second inverter comprising a second pull-up transistor and a second pull-down transistor, a first pass transistor coupled to the first inverter, and a second pass transistor coupled to the second inverter. Preferably, the first inverter is coupled to a first tunnel magnetoresistance (TMR) structure and the second inverter is coupled to a second TMR structure.

7 Claims, 6 Drawing Sheets

(56) References Cited

U.S. PATENT DOCUMENTS

| | | |
|---|---|---|
| 8,018,768 B2 | 9/2011 | Shih et al. |
| 8,154,916 B2 * | 4/2012 | Sugiyama .......... G11C 14/0081 |
| | | 365/154 |
| 8,295,079 B2 | 10/2012 | Yamamoto et al. |
| 8,508,983 B2 | 8/2013 | Wang et al. |
| 9,053,782 B2 * | 6/2015 | Guillemenet ...... G11C 13/0002 |
| 2010/0188891 A1 * | 7/2010 | Taniguchi .......... G11C 14/0081 |
| | | 365/158 |
| 2011/0216573 A1 * | 9/2011 | Abe ........................ G11C 11/21 |
| | | 365/148 |
| 2011/0273925 A1 * | 11/2011 | Yamamoto ......... G11C 14/0081 |
| | | 365/154 |
| 2012/0280713 A1 * | 11/2012 | Katoh .............. H03K 3/356008 |
| | | 326/46 |
| 2012/0320658 A1 * | 12/2012 | Wang ................ G11C 14/0054 |
| | | 365/148 |
| 2014/0070844 A1 * | 3/2014 | Guillemenet ......... G11C 11/412 |
| | | 326/41 |
| 2014/0167816 A1 * | 6/2014 | Guillemenet ...... G11C 13/0002 |
| | | 326/41 |
| 2014/0339616 A1 * | 11/2014 | Abe ..................... H01L 27/228 |
| | | 257/295 |
| 2016/0276031 A1 * | 9/2016 | Abe ................... G11C 14/0081 |
| 2017/0229179 A1 * | 8/2017 | Sugahara ........... G11C 14/0081 |

* cited by examiner

STATIC RANDOM ACCESS MEMORY

BACKGROUND OF THE INVENTION

1. Field of the Invention

The invention relates to a static random access memory (SRAM), and more particularly to a SRAM connected to a tunnel magnetoresistance (TMR) structure.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer system as a cache memory.

However typical SRAMs are non-volatile devices such that signals are turned off almost instantly when the voltage is shutoff. Hence how to enhance the performance regarding this feature under the same architecture has become an important task in this field.

SUMMARY OF THE INVENTION

According to an embodiment of the present invention, a static random access memory (SRAM) structure includes a first inverter comprising a first pull-up transistor and a first pull-down transistor, a second inverter comprising a second pull-up transistor and a second pull-down transistor, a first pass transistor coupled to the first inverter, and a second pass transistor coupled to the second inverter. Preferably, the first inverter is coupled to a first tunnel magnetoresistance (TMR) structure and the second inverter is coupled to a second TMR structure.

According to another aspect of the present invention, a static random access memory (SRAM) structure includes a first pass transistor comprising a first source/drain terminal coupled to a first storage node, a second pass transistor comprising a second source/drain terminal coupled to a second storage node, a first drive transistor comprising a third source/drain terminal coupled to the first storage node, a second drive transistor comprising a fourth source/drain terminal coupled to the second storage node, a first tunnel magnetoresistance (TMR) structure coupled to the first storage node, and a second TMR structure coupled to the second storage node.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
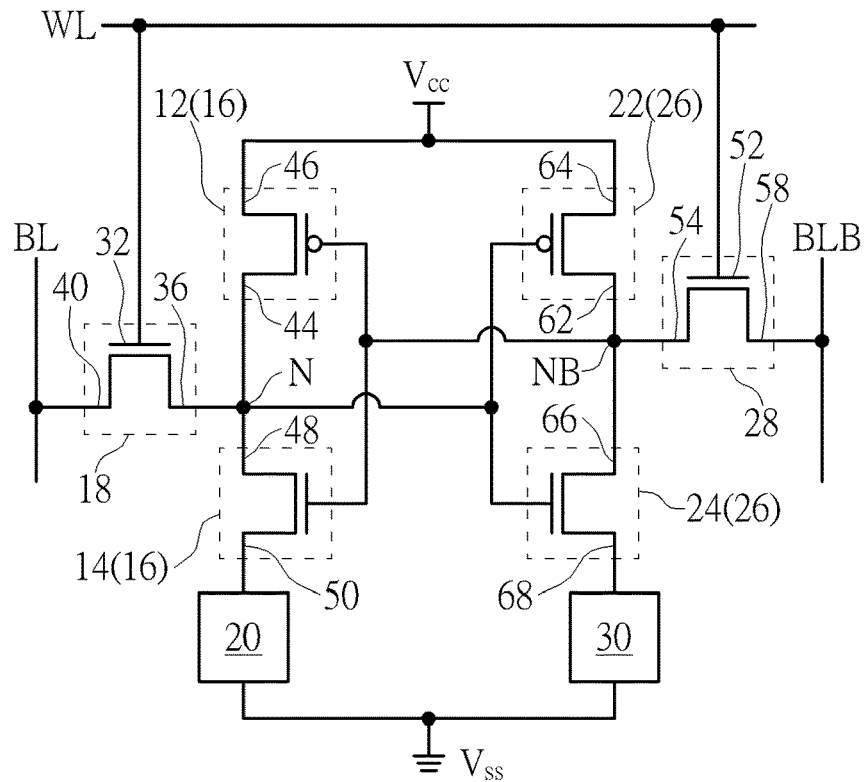
FIG. 1 illustrates a circuit diagram of a SRAM structure according to an embodiment of the present invention.

Referring to FIG. 1, FIG. 1 illustrates a circuit diagram of a SRAM structure according to an embodiment of the present invention. As shown in FIG. 1, the SRAM is preferably a six-transistor SRAM (6T-SRAM), in which the 6T-SRAM is made of a first inverter 16 having a pull-up transistor 12 and a pull-down transistor 14, a pass transistor 18 coupled to the first inverter 16, a TMR structure 20 coupled to the first inverter 16, a second inverter 26 having a pull-up transistor 22 and a pull-down transistor 24, a pass transistor 28 coupled to the second inverter 26, and another TMR structure 30 coupled to the second inverter 26.

In this embodiment, the pass transistor 18 includes a gate terminal 32 coupled to or directly connecting a word line WL, a source/drain terminal 36 coupled to or directly connecting a storage node N, and a drain/source terminal 40 coupled to or directly connecting a bit line BL. The pull-up transistor 12 of the first inverter 16 preferably includes a source/drain terminal 44 coupled to the storage node N and a drain/source terminal 46 coupled to a voltage source (such as Vcc), and the pull-down transistor 14 includes a source/drain terminal 48 coupled to the storage node N and a drain/source terminal 50 directly connecting the TMR structure 20.

The pass transistor 28 includes a gate terminal 52 coupled to or directly connecting the word line WL, a source/drain terminal 54 coupled to or directly connecting a storage node NB, and a drain/source terminal 58 coupled to or directly connecting another bit line BLB. Similar to the first inverter 16, the pull-up transistor 22 of the second inverter 26 includes a source/drain terminal 62 coupled to the storage node NB and a drain/source terminal 64 coupled to the voltage source Vcc. The pull-down transistor 24 on the other hand includes a source/drain terminal 66 coupled to the storage node NB and a drain/source terminal 68 directly connecting another TMR structure 30, in which the TMR structure 20 and the TMR structure 30 are directly connected to another voltage (Vss).

In this embodiment, the TMR structures 20, 30 coupled to the first inverter 16 and the second inverter 26 are also referred to as magnetic tunnel junction (MTJ) structure. By connecting the TMR structures 20 and 30 to the first inverter 16 and the second inverter 26 of the 6T-SRAM, the present invention is able to provide an extra magnetoresistive random access memory (MRAM) mode for the device so that the SRAM device could store signals even when voltages are being cut off.

In this embodiment, each of the TMR structures 20, 30 could include a first electrode layer, a fixed layer, a free layer, a capping layer, and a second electrode depending on the demand of the process. Preferably, the first electrode layer and the second electrode layer are made of conductive material including but not limited to for example Ta, Pt, Cu, Au, Al, or combination thereof. The fixed layer could be made of antiferromagnetic (AFM) material including but not limited to for example ferromanganese (FeMn), platinum manganese (PtMn), iridium manganese (IrMn), nickel oxide (NiO), or combination thereof, in which the fixed layer is formed to fix or limit the direction of magnetic moment of adjacent layers. The free layer could be made of ferromagnetic material including but not limited to for example iron, cobalt, nickel, or alloys thereof such as cobalt-iron-boron (CoFeB), in which the magnetized direction of the free layer could be altered freely depending on the influence of outside magnetic field. The capping layer could be made of insulating material including but not limited to for example oxides such as aluminum oxide ($AlO_x$) or magnesium oxide (MgO).

Figure 2:
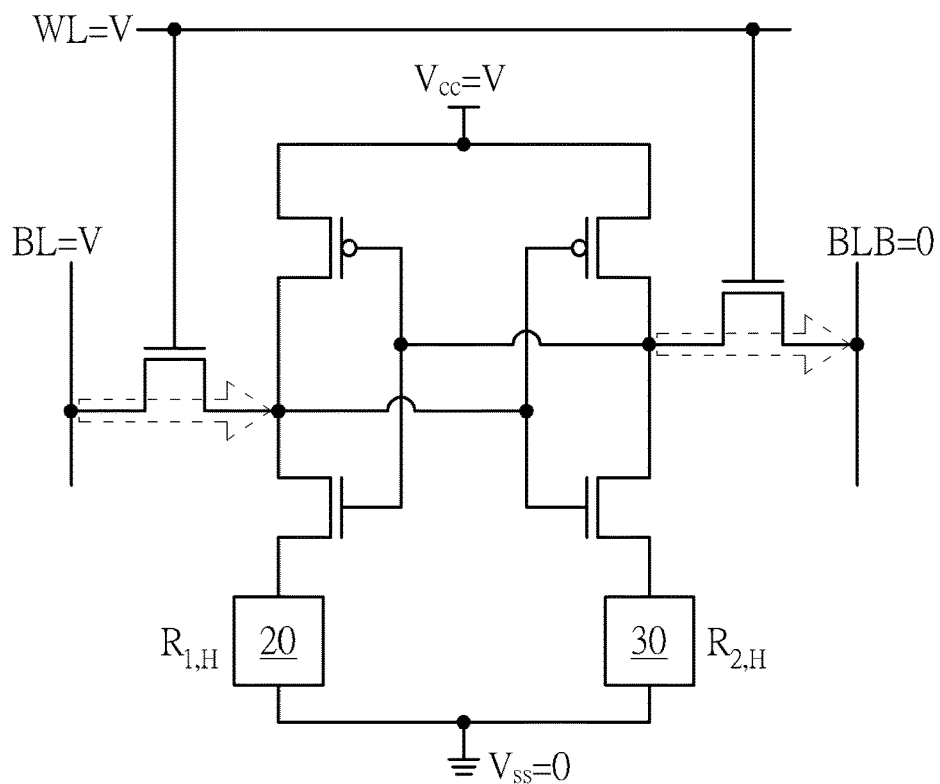
FIG. 2 illustrates a circuit diagram of a 6T-SRAM operating under a write SRAM mode.
Figure 3:
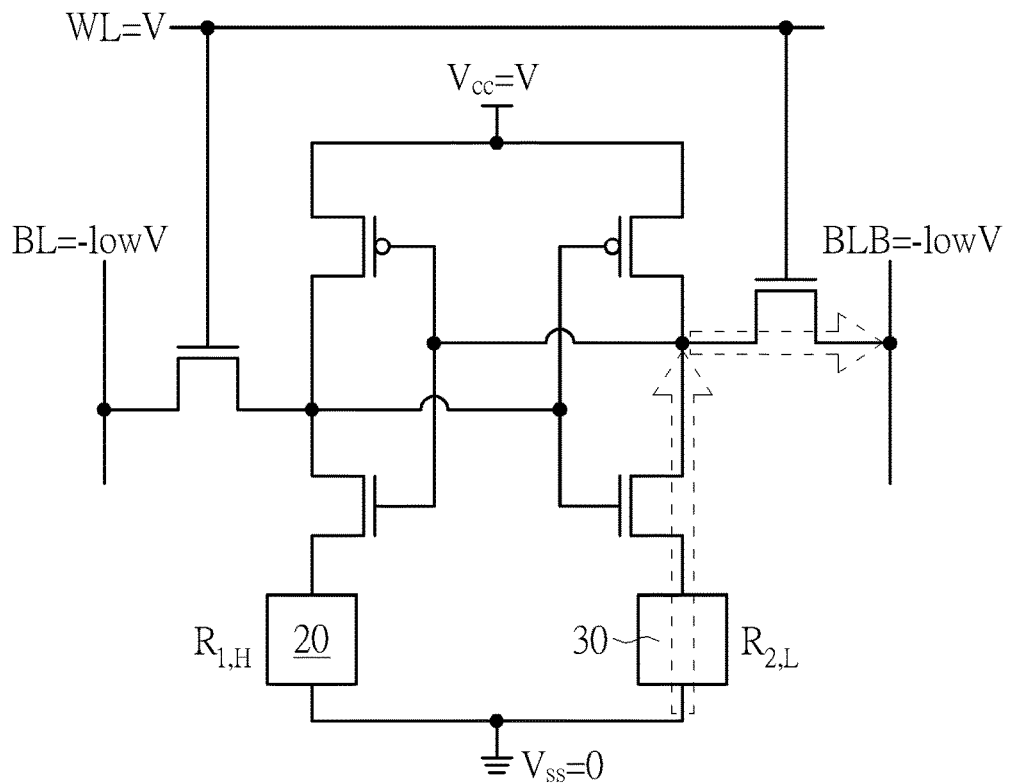
FIG. 3 illustrates a circuit diagram of a 6T-SRAM operating under a write MRAM mode.
Figure 4:
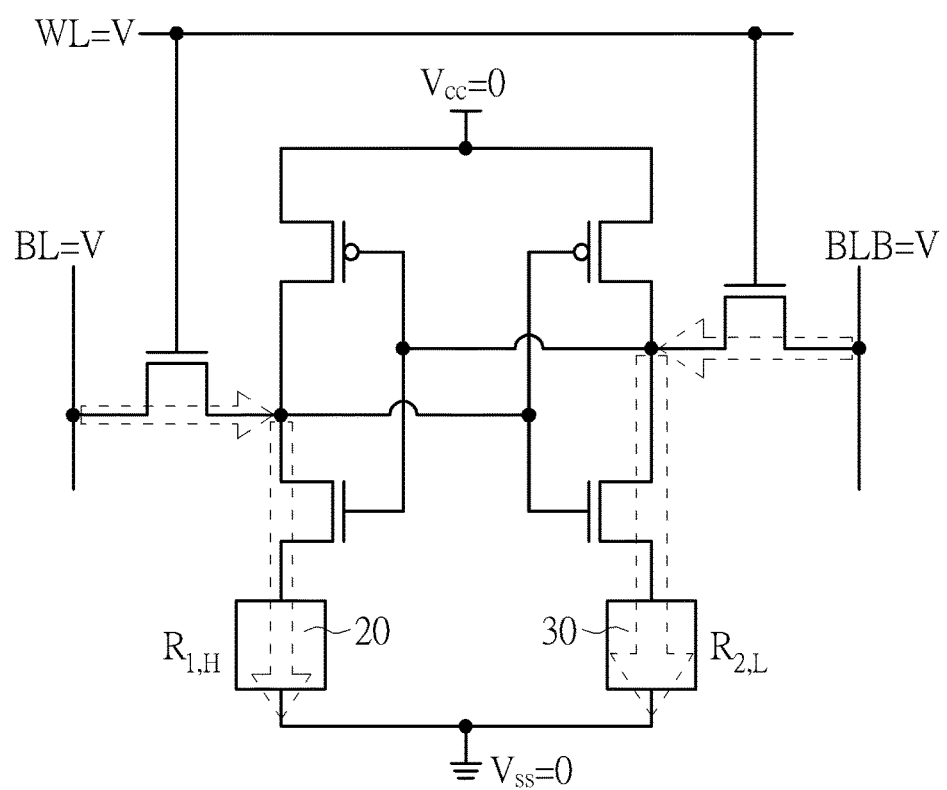
FIG. 4 illustrates a circuit diagram of a 6T-SRAM operating under a non-volatile database (NVDB) read mode.
Figure 5:
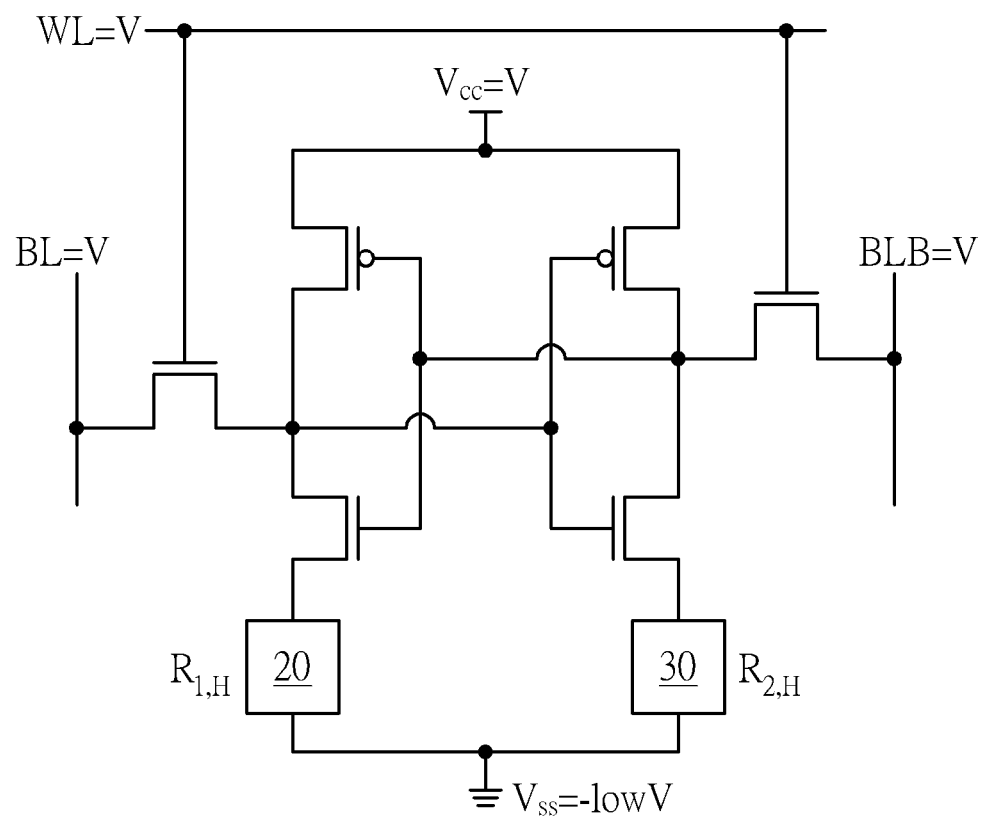
FIG. 5 illustrates a circuit diagram of a 6T-SRAM operating under an initialize mode.
Figure 6:
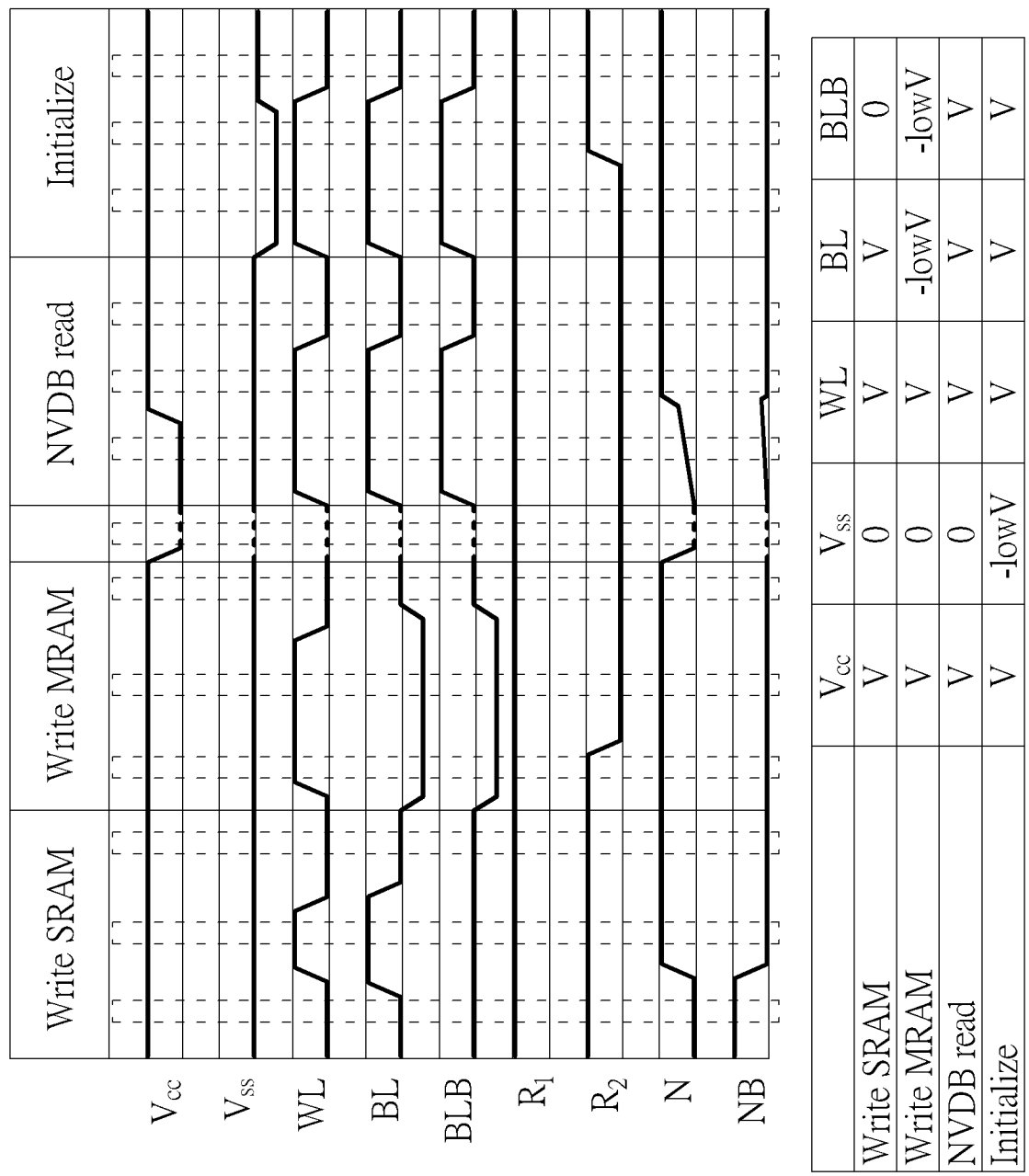
FIG. 6 is a table illustrating voltage changes and operation conditions of a 6T-SRAM operating under the aforementioned modes.

Referring to FIGS. 2-6, FIG. 2 illustrates a circuit diagram of the 6T-SRAM operating under a write SRAM mode, FIG. 3 illustrates a circuit diagram of the 6T-SRAM operating under a write MRAM mode, FIG. 4 illustrates a circuit diagram of the 6T-SRAM operating under a non-volatile database (NVDB) read mode, FIG. 5 illustrates a circuit diagram of the 6T-SRAM operating under an initialize mode, and FIG. 6 is a table illustrating voltage changes and operation conditions of the 6T-SRAM operating under the aforementioned modes.

As shown in FIG. 2, a typical SRAM operation is accomplished by using a change in voltage difference between the bit line BL and the bit line BLB to write 0 and 1. If a computer were to enter a sleep mode or if the power is about to be shut off, it would be desirable to first store the 0 and 1 signals into the TMR structures 20, 30 and the storage of such signals could be accomplished by altering the resistance. It should be noted that electrical current of a typical SRAM usually flows downward and assuming that the downward direction were in high resistance state such as the TMR structures were in high resistance ($R_H$) state or more specifically the TMR structure 20 is in high resistance state ($R_{1,H}$) and the TMR structure 30 is also in high resistance state ($R_{2,H}$), it would then be necessary to generate a reverse current so that one side is changed to a low resistance state.

As shown in FIG. 3, if the MRAM or the TMR structures 20, 30 were to be written, it would be necessary to generate a reverse current and such operation could be accomplished by lowering the voltage on both ends of the bit line BL and the bit line BLB. For instance, low voltage (−low V) could be applied to the bit line BL and the bit line BLB at the same time as shown in the figure so that the TMR structure 30 on the right is preferably changed from the original high resistance state ($R_{2,H}$) to a low resistance state ($R_{2,L}$). By doing so, a write operation is conducted upon the TMR structures 20, 30.

As shown in FIG. 4, after the sleep mode is done or when the device is being restarted, it would be desirable to provide greater voltage from the outside such as by applying positive voltage to the bit line BL and the bit line BLB. Since the TMR structure 30 has lower resistance while the TMR structure 20 has higher resistance, it would be desirable to applying same voltage V to both the bit line BL and the bit line BLB at the same time and as the voltage or electrical potential of the TMR structure 20 on the left is higher than the electrical potential of the TMR structure 30 on the right, the 0 and 1 signals could be read out or extracted out again from the TMR structures. Since the TMR structures belong to a type of non-volatile database, the operation at this stage is also referred as the non-volatile database (NVDB) read mode.

As shown in FIG. 5, since one of the TMR structures 20, 30 is still in high resistance state while the other is in low resistance state thereby resulting in an unbalanced structure after the signals are read, it would be desirable to generate a downward current such as by applying a negative voltage (−low V) to the Vss so that the TMR structure 30 which was in low resistance state ($R_{2,L}$) is changed back to high resistance state ($R_{2,H}$) once more. After changing the TMR structures 20, 30 to the original state the device is ready for the next writing operation.

Figure 7:
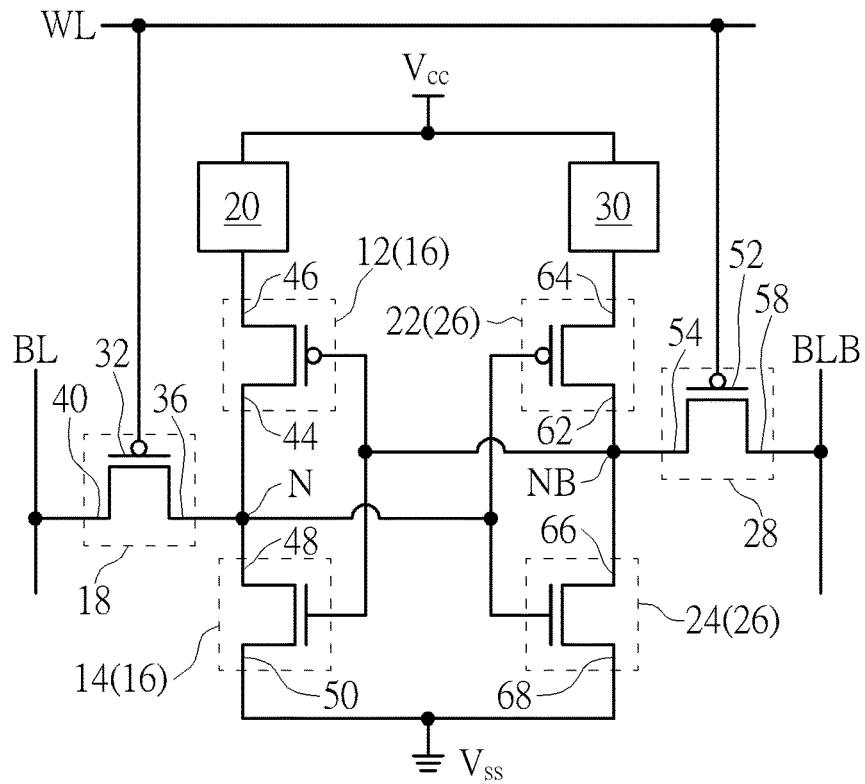
FIG. 7 illustrates a circuit diagram of a 6T-SRAM structure according to an embodiment of the present invention.

Referring to FIG. 7, FIG. 7 illustrates a circuit diagram of a SRAM structure according to an embodiment of the present invention. As shown in FIG. 7, the SRAM is preferably a 6T-SRAM, in which the 6T-SRAM is made of a first inverter 16 having a pull-up transistor 12 and a pull-down transistor 14, a pass transistor 18 coupled to the first inverter 16, a TMR structure 20 coupled to the first inverter 16, a second inverter 26 having a pull-up transistor 22 and a pull-down transistor 24, a pass transistor 28 coupled to the second inverter 26, and another TMR structure 30 coupled to the second inverter 26.

In this embodiment, the pass transistor 18 includes a gate terminal 32 coupled to or directly connecting a word line WL, a source/drain terminal 36 coupled to or directly connecting a storage node N, and a drain/source terminal 40 coupled to or directly connecting a bit line BL. The pull-up transistor 12 of the first inverter 16 preferably includes a source/drain terminal 44 coupled to the storage node N and a drain/source terminal 46 coupled to or directly connecting the TMR structure 20, and the pull-down transistor 14 includes a source/drain terminal 48 coupled to the storage node N and a drain/source terminal 50 directly connecting a voltage source Vss.

The pass transistor 28 includes a gate terminal 52 coupled to or directly connecting the word line WL, a source/drain terminal 54 coupled to or directly connecting a storage node NB, and a drain/source terminal 58 coupled to or directly connecting another bit line BLB. Similar to the first inverter 16, the pull-up transistor 22 of the second inverter 26 includes a source/drain terminal 62 coupled to the storage node NB and a drain/source terminal 64 coupled to or directly connecting another TMR structure 30. The pull-down transistor 24 on the other hand includes a source/drain terminal 66 coupled to the storage node NB and a drain/source terminal 68 directly connecting the voltage source Vss. Preferably, the TMR structure 20 and the TMR structure 30 are directly connected to another voltage (Vcc). It should be noted that since this architecture is preferred for PMOS devices, the pass transistors 18, 28 shown in FIG. 7 are illustrated as PMOS transistors.

Figure 8:
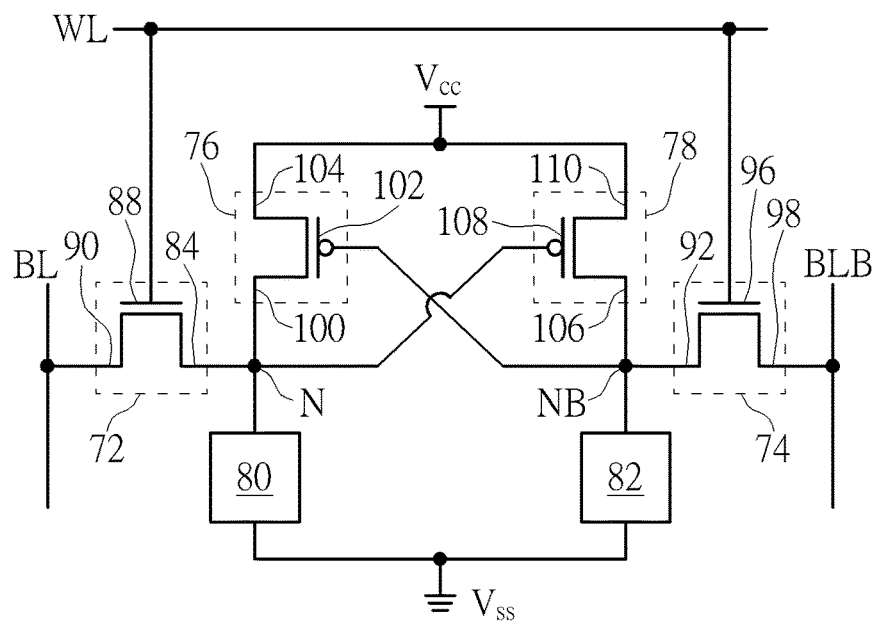
FIG. 8 illustrates a circuit diagram of a 4T-SRAM structure according to an embodiment of the present invention.

Referring to FIG. 8, FIG. 8 illustrates a circuit diagram of a SRAM structure according to an embodiment of the present invention. As shown in FIG. 8, the SRAM preferably includes a four-transistor SRAM (4T-SRAM), in which the 4T-SRAM includes a pass transistor 72, a pass transistor 74, a drive transistor 76, a drive transistor 78, and two TMR structure 80, 82 and the drive transistors 76, 78 in this embodiment are preferably pull-up transistors.

In this embodiment, the pass transistor 72 includes a source/drain terminal 84 coupled to or directly connecting a storage node N, a gate terminal 88 coupled to or directly connecting a word line WL, and a drain/source terminal 90 coupled to or directly connecting a bit line BL. The pass transistor 74 includes a source/drain terminal 92 coupled to or directly connecting another storage node NB, a gate terminal 96 coupled to or directly connecting the word line WL, and a drain/source terminal 98 coupled to or directly connecting another bit line BLB. The drive transistor 76 includes a source/drain terminal 100 coupled to or directly connecting the storage node N, a gate terminal 102 coupled to or directly connecting the storage node NB, and a drain/source terminal 104 coupled to or directly connecting a voltage source Vcc. The drive transistor 78 includes a source/drain terminal 106 coupled to or directly connecting the storage node NB, a gate terminal 108 coupled to or directly connecting the storage node N, and a drain/source terminal 110 coupled to or directly connecting the voltage source Vcc. The TMR structure 80 is coupled to or directly connecting the storage node N and another voltage source Vss and the TMR structure 82 is coupled to or directly connecting the storage node NB and the voltage source Vss.

Figure 9:
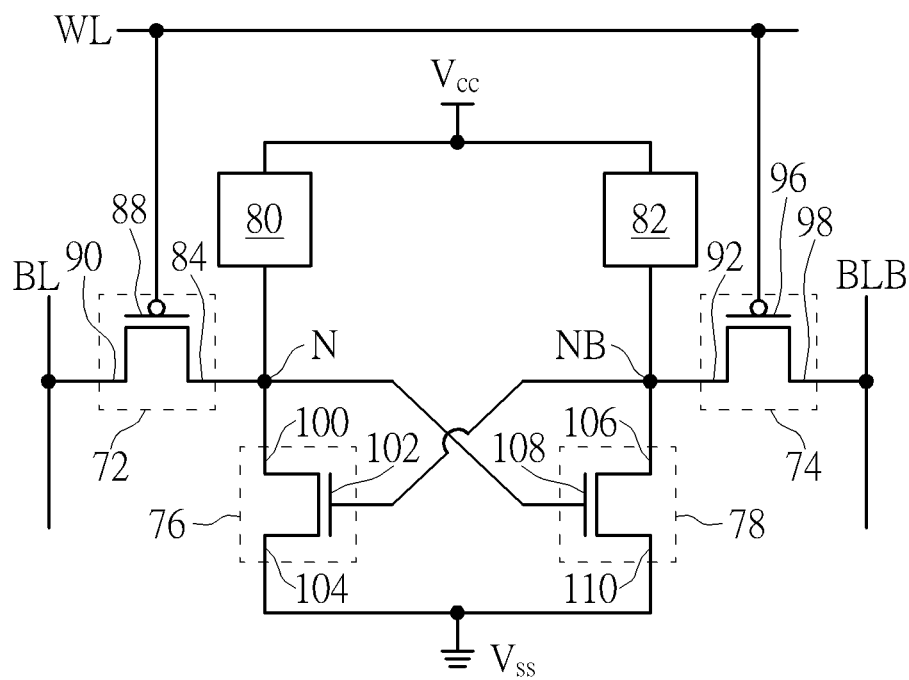
FIG. 9 illustrates a circuit diagram of a 4T-SRAM structure according to an embodiment of the present invention.

Referring to FIG. 9, FIG. 9 illustrates a circuit diagram of a SRAM structure according to an embodiment of the present invention. As shown in FIG. 9, the SRAM preferably includes a four-transistor SRAM (4T-SRAM), in which the 4T-SRAM includes a pass transistor 72, a pass transistor 74, a drive transistor 76, a drive transistor 78, and two TMR structure 80, 82 and the drive transistors 76, 78 in this embodiment are preferably pull-down transistors.

In this embodiment, the pass transistor 72 includes a source/drain terminal 84 coupled to or directly connecting a storage node N, a gate terminal 88 coupled to or directly connecting a word line WL, and a drain/source terminal 90 coupled to or directly connecting a bit line BL. The pass transistor 74 includes a source/drain terminal 92 coupled to or directly connecting another storage node NB, a gate terminal 96 coupled to or directly connecting the word line WL, and a drain/source terminal 98 coupled to or directly connecting another bit line BLB. The drive transistor 76 includes a source/drain terminal 100 coupled to or directly connecting the storage node N, a gate terminal 102 coupled to or directly connecting the storage node NB, and a drain/source terminal 104 coupled to or directly connecting a voltage source Vss. The drive transistor 78 includes a source/drain terminal 106 coupled to or directly connecting the storage node NB, a gate terminal 108 coupled to or directly connecting the storage node N, and a drain/source terminal 110 coupled to or directly connecting the voltage source Vss. The TMR structure 80 is coupled to or directly connecting the storage node N and another voltage source Vcc and the TMR structure 82 is coupled to or directly connecting the storage node NB and the voltage source Vcc. Similar to the embodiment shown in FIG. 7, since this architecture is preferred for PMOS devices, the pass transistors 72, 74 shown in FIG. 7 are illustrated as PMOS transistors.

Overall, the present invention preferably integrates MRAM elements such as the aforementioned TMR structures to a 6T-SRAM or 4T-SRAM architecture. Since data or signals stored in conventional volatile SRAM devices are erased instantly when power supplied to the devices are cut off, the present invention is able to provide an additional MRAM mode by integrating the TMR structures in the SRAM device so that signals could still be stored within the device even when voltages are being cut off.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory (SRAM) structure, comprising:
    a four-transistors SRAM (4T-SRAM), wherein the 4T-SRAM comprises a first pass transistor, a second pass transistor, a first drive transistor and a second drive transistor;
    the first pass transistor comprising a first source/drain terminal coupled to a first storage node;
    the second pass transistor comprising a second source/drain terminal coupled to a second storage node;
    the first drive transistor comprising a third source/drain terminal coupled to the first storage node;
    the second drive transistor comprising a fourth source/drain terminal coupled to the second storage node;
    a first magnetic tunnel junction (MTJ) structure coupled to the first storage node, wherein the first MTJ structure does not comprise a gate; and
    a second magnetic tunnel junction (MTJ) structure coupled to the second storage node, wherein the second MTJ structure does not comprise a gate, wherein the first MTJ structure is coupled between the first storage node and a Vss voltage source, and the second MTJ structure is coupled between the second storage node and the Vss voltage source.

2. The SRAM structure of claim 1, wherein the first pass transistor comprises a first gate terminal coupled to a word line and a first drain/source terminal coupled to a first bit line.

3. The SRAM structure of claim 1, wherein the second pass transistor comprises a second gate terminal coupled to the word line and a second drain/source terminal coupled to a second bit line.

4. The SRAM structure of claim 1, wherein the first drive transistor comprises a third gate terminal coupled to the second storage node and a third drain/source terminal coupled to a Vcc voltage source.

5. The SRAM structure of claim 4, wherein the second drive transistor comprises a fourth gate terminal coupled to the first storage node and a fourth drain/source terminal coupled to the Vcc voltage source.

6. The SRAM structure of claim 1, wherein the first and second magnetic tunnel junction (MTJ) structures do not have MOS transistor structure.

7. The SRAM structure of claim 1, wherein the first magnetic tunnel junction (MTJ) structure is not directly connected to the gate of the first drive transistor.

* * * * *